United States Patent [19]
Matsuo et al.

[11] Patent Number: 5,343,432
[45] Date of Patent: Aug. 30, 1994

[54] SEMICONDUCTOR MEMORY DEVICE HAVING EQUALIZATION TERMINATED IN DIRECT RESPONSE TO A CHANGE IN WORD LINE SIGNAL

[75] Inventors: Ryuichi Matsuo; Ryuichi Kosugi; Nobuhiro Tsuda; Osamu Ishizaki, all of Hyogo, Japan

[73] Assignee: Mitsubishi Denki Kabushiki Kaisha, Tokyo, Japan

[21] Appl. No.: 669,725

[22] Filed: Mar. 14, 1991

[30] Foreign Application Priority Data

Mar. 23, 1990 [JP] Japan .................................. 2-75123

[51] Int. Cl.$^5$ .......................... G11C 7/00; G11C 8/00
[52] U.S. Cl. .................................. 365/203; 365/233.5
[58] Field of Search .................. 365/233.5, 203, 204, 365/189.05

[56] References Cited

U.S. PATENT DOCUMENTS

| | | | |
|---|---|---|---|
| 4,564,925 | 1/1986 | Onishi et al. | 365/233.5 X |
| 4,658,381 | 4/1987 | Reed et al. | 365/233.5 X |
| 4,661,931 | 4/1987 | Flannagan et al. | 365/233.5 X |
| 4,689,771 | 8/1987 | Wang et al. | 365/233.5 |
| 4,712,197 | 12/1987 | Sood | 365/233.5 X |
| 4,730,279 | 3/1988 | Ohtani | 365/233.5 |
| 4,996,671 | 2/1991 | Suzuki et al. | 365/203 |
| 5,043,945 | 8/1991 | Bader | 365/204 X |
| 5,053,997 | 10/1991 | Miyamoto et al. | 365/203 X |
| 5,091,889 | 2/1992 | Hamano et al. | 365/233.5 |

OTHER PUBLICATIONS

"Static RAMs", *Digest of Technical Papers of IEEE International Solid-State Circuit Conference,* by Minato et al, pp. 222-223, 1984.

*Primary Examiner*—Benny Lee
*Attorney, Agent, or Firm*—Lowe, Price, LeBlanc & Becker

[57] ABSTRACT

A semiconductor memory device includes an array of memory cells arranged in rows and columns; a plurality of word lines connected to the rows of the memory cells; a plurality of bit lines connected to the columns of the memory cells; word line selection means; bit line selection means; and equalizing means for equalizing the bit line to a desired voltage level in response to an address signal, and for terminating the equalization in response to change in a signal on a word line according to change in the address signal.

9 Claims, 6 Drawing Sheets

FIG.3
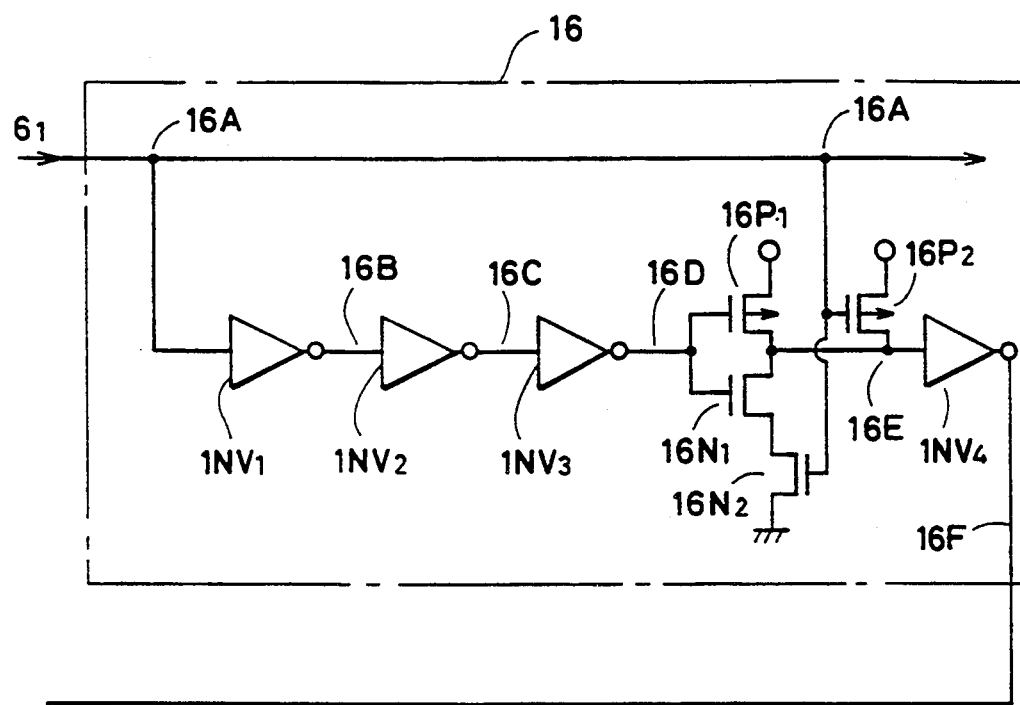
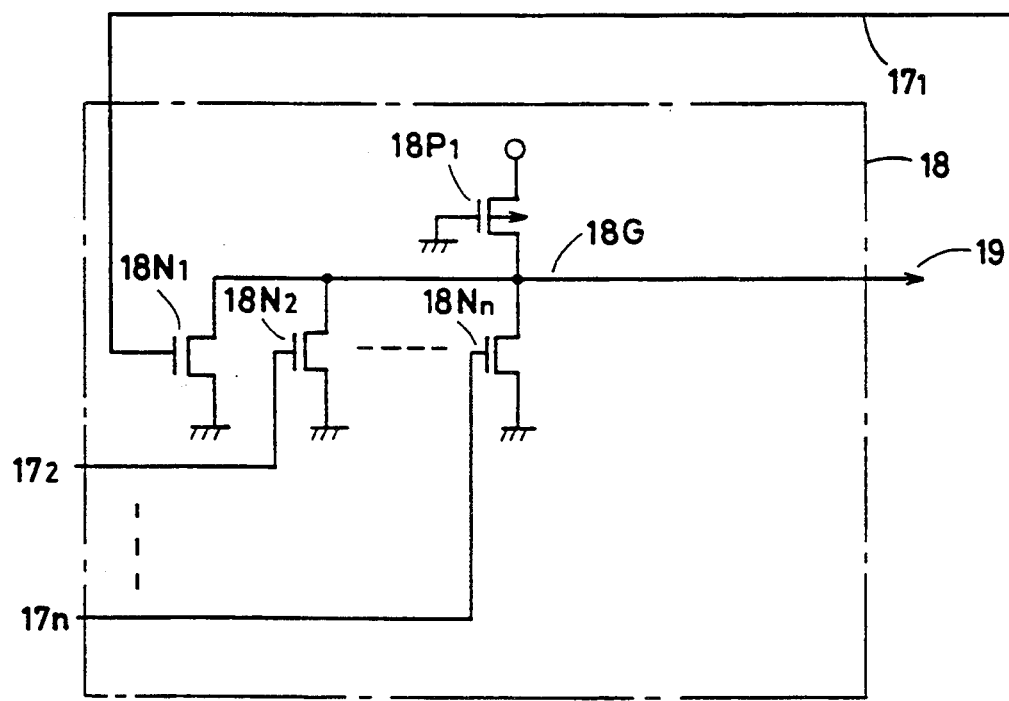

SEMICONDUCTOR MEMORY DEVICE HAVING EQUALIZATION TERMINATED IN DIRECT RESPONSE TO A CHANGE IN WORD LINE SIGNAL

BACKGROUND OF THE INVENTION

1. Field of the Invention

The present invention relates to semiconductor memory devices, and more particularly, to an improvement in access time of a semiconductor memory device.

2. Description of the Background Art

Static RAMs (Random Access Memory), dynamic RAMs, EP-ROMs (Erasable Programmable Read Only Memory), mask ROMs, etc. are known as semiconductor memory devices. Increase in memory capacity and reduction in access time are the most desired features in such semiconductor memory devices. This is because the performance of electronic equipment incorporating the semiconductor memory device is mainly determined by the memory capacity and access time thereof.

Advanced processing techniques that can minimize the width of the patterned conductor line is necessary for increasing memory capacity. Also, processing techniques for forming silicide gates and double-layered aluminum wirings of field effect transistors, for example, are necessary to decrease resistivity of inner wiring for reducing access time. In recent years, ATD (Address Transition Detector) circuits have been employed in semiconductor memory devices to reduce access time by improvement in circuit design. An ATD circuit senses an address input signal to generate a pulse signal. The pulse signal provided from the ATD circuit operates dynamically the inner circuitry of the semiconductor memory device, resulting in reduction in access time. An example of a dynamic operation of a static RAM will be explained hereinafter.

FIG. 5 is a block diagram showing an example of a static RAM according to prior art. Referring to the semiconductor memory device of FIG. 5, external address signals $1_l$-$1_n$ pass an address buffer 2 to drive a word line selection decoder 3 and a bit line selection decoder 4. Word line selection decoder 3 selects one of word lines $6_l$-$6_n$, to which a signal of H (high) level is applied. Memory cells $5_l$-$5_n$ are connected to word lines $6_l$-$6_n$, respectively. A memory cell connected to the selected word line provides an information signal of H (high) level or L (low) level to BIT lines $9a_l$-$9a_n$ and $\overline{BIT}$ lines $9b_l$-$9b_n$.

In response to the output signal of bit line selection decoder 4, a bit line selection circuit 8 selects a desired bit line pair out of BIT lines $9a_l$-$9a_n$ and $\overline{BIT}$ lines $9b_l$-$9b_n$, whereby the signal of the selected bit line pair is provided to a sense amplifier 13. Sense amplifier 13 amplifies the signal level of the information signal. This amplified information signal is applied to an output buffer 14, whereby an H level or L level representing the information signal appears at external output terminals $15_l$-$15_n$.

An ATD circuit 11 receives a signal from address buffer 2 to provide a predetermined pulse signal on output line 12 in synchronization with the rise and fall of external address input signal $1_l$-$1_n$. The output 12 of ATD circuit 11 controls the ON/OFF of a switching transistor 10 between BIT lines $9a_l$-$9a_n$ and $\overline{BIT}$ lines $9b_l$-$9b_n$. The output of the ATD circuit also functions to equalize the signal line between bit line selection circuit 8 and sense amplifier 13, sense amplifier 13 itself, and the signal line between sense amplifier 13 and output buffer 14 to a desirable potential.

FIG. 6 shows several examples of signal waveforms of the static RAM of FIG. 5 in comparison with signal waveforms of a static RAM that does not have an ATD circuit. In a static RAM not having an ATD circuit, a word line signal B1 rises after address input signal A1 rises. When word line signal B1 rises, bit line pair signal D1 is provided.

In a static RAM having an ATD circuit, word line signal B2 rises after the rise of address input signal A2. Also, an ATD pulse C2 is generated in response to the rise or fall of address input signal A2. Because ATD pulse C2 turns on switching transistor 10 of FIG. 5 to make a short circuit between the BIT line and the $\overline{BIT}$ line, BIT line and $\overline{BIT}$ line are equalized to an intermediate level (refer to bit line pair signal D2) during the duration period of ATD pulse C2. After ATD pulse C2 attains an L level to turn off switching transistor 10, signal B2 on the selected word line attains an H level. Accordingly, an information signal of H or L is provided from the memory cell connected to the selected word line onto the bit line pair. Because the BIT line and the $\overline{BIT}$ line change to an H level or an L level from the intermediate level at this time, the access time is reduced by time in comparison with the static RAM not having an ATD circuit where the BIT line and the $\overline{BIT}$ line changes from an L to H level, or from an H to L level.

Similarly, the signal line between bit line selection circuit 8 and sense amplifier 13, the sense amplifier 13 itself, and the signal line between sense amplifier 13 and output buffer 14 are equalized to the intermediate level only during the duration period of ATD pulse C2, resulting in further reduction in access time. The equalization of the sense amplifier itself is described in Digest of Technical Papers of IEEE International Solid-State Circuit Conference, 1984, pp. 222–223 by Minato, et al., for example.

In the static RAM of FIG. 5 according to the prior art, it is necessary to limit the duration period of ATD pulse C2 to be within a time period range from the rise of address signal A2 to the rise of signal B2 of the selected word line. This is because if ATD pulse C2 is still maintained even after word line signal B2 rises, BIT line and $\overline{BIT}$ line cannot be isolated into an H level and an L level, resulting in increase in access time due to ATD pulse C2.

Since ATD circuit 11 comprises a transistor logic, a capacitor and the like, the duration period of ATD pulse C2 is liable to change due to variation in channel width and threshold voltage of the transistor. Therefore, there was a problem that the access time is increased when the duration time of ATD pulse C2 provided from ATD circuit 11 is long.

SUMMARY OF THE INVENTION

In view of the foregoing, an object of the present invention is to provide a semiconductor memory device that can have the access time reduced more reliably.

According to the present invention, a semiconductor memory device includes an array of memory cells arranged in rows and columns; a plurality of word lines connected to the rows of the memory cells; a plurality of bit lines connected to the columns of the memory cells; word line selection means; bit line selection means; and equalizing means for equalizing the voltage of the bit line to a desired level in response to an address signal, and for terminating the equalization in response to the change of a signal on a word line according to the change of the address signal.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a circuit diagram of an example of a word line ATD circuit and a word line ATD global circuit of the static RAM of FIG. 1.

DESCRIPTION OF THE PREFERRED EMBODIMENTS

Figure 1:
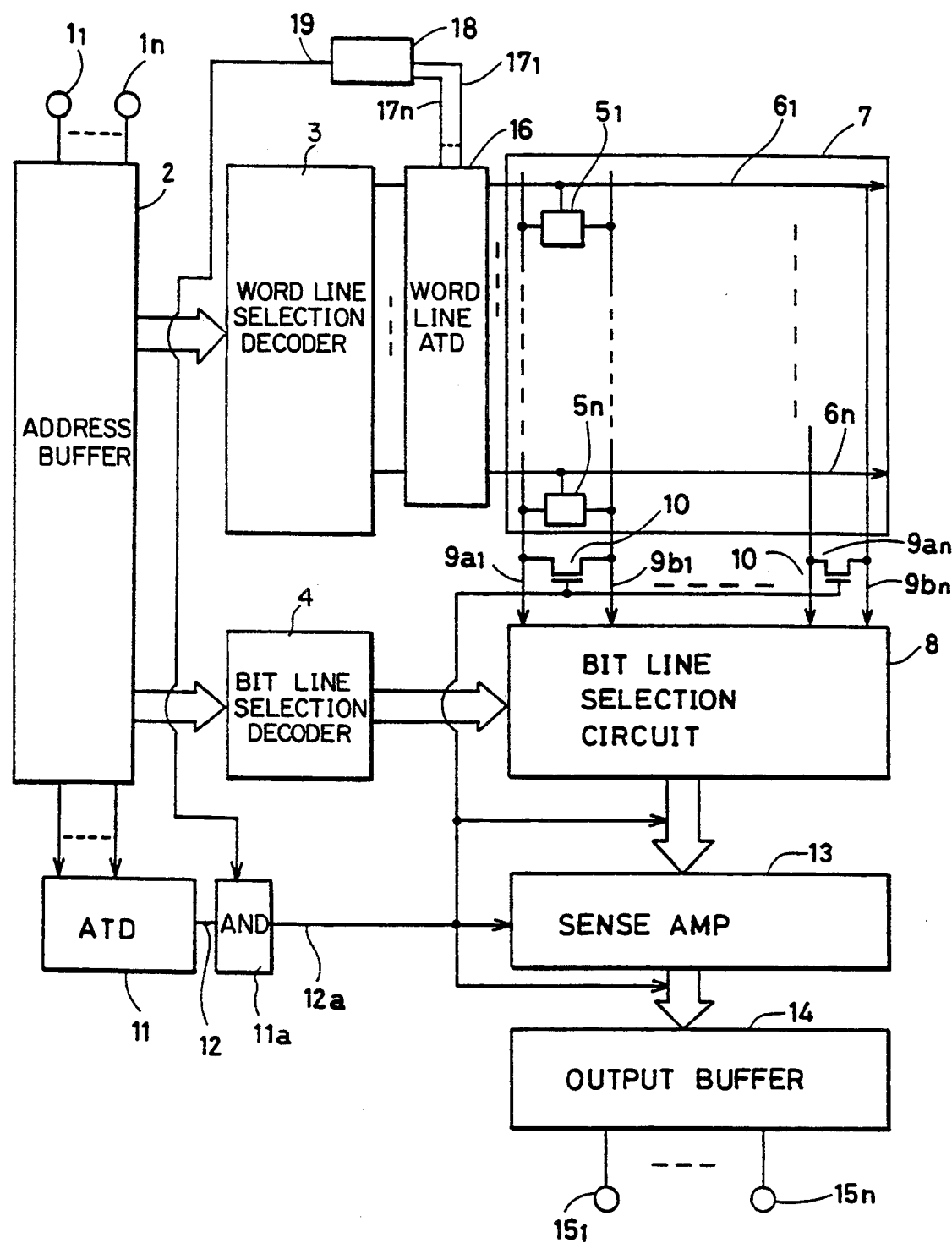
FIG. 1 is a block diagram of a static RAM according to an embodiment of the present invention.
Figure 5:
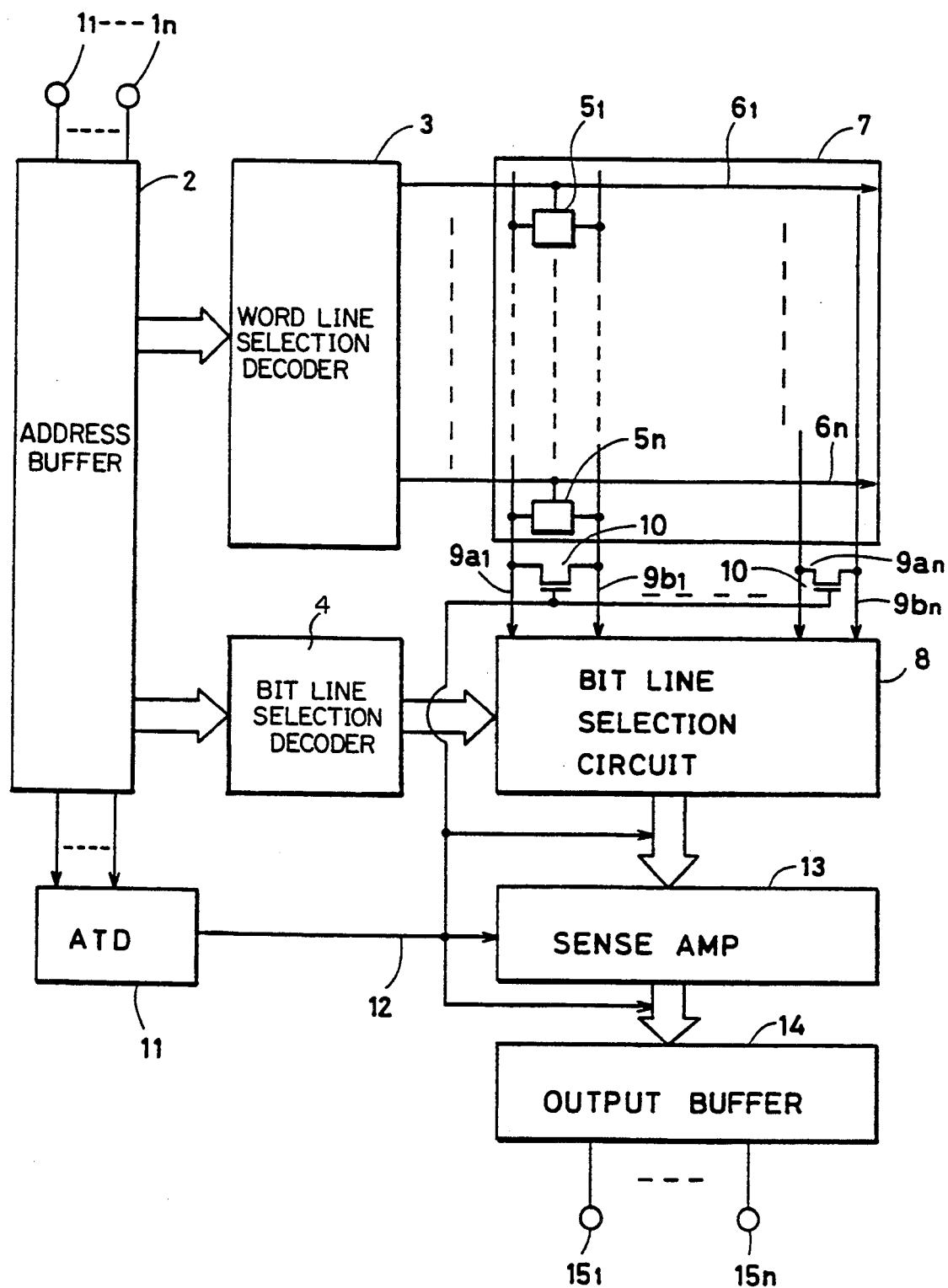
FIG. 5 is a block diagram showing an example of a static RAM of the prior art.
Figure 6:
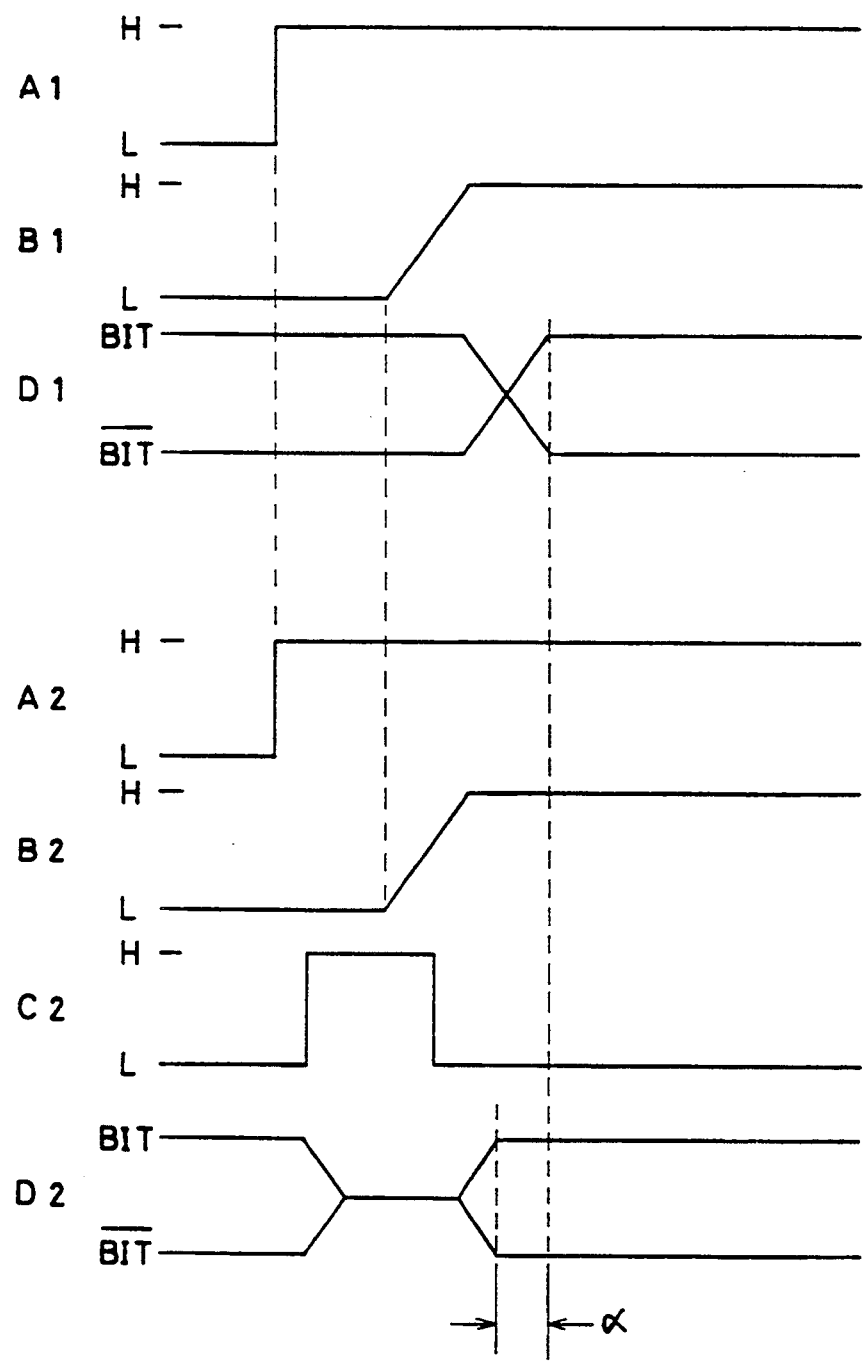
FIG. 6 is a waveform chart of various signals in the static RAM of FIG. 5.

FIG. 1 is a static RAM of an embodiment of the present invention. The same reference characters as those of FIG. 5 indicate corresponding components. The static RAM of FIG. 1 is similar to that of FIG. 5, except for additional inclusion of a word line ATD circuit 16, a word line ATD global circuit 18, and an AND circuit 11a.

Figure 2:
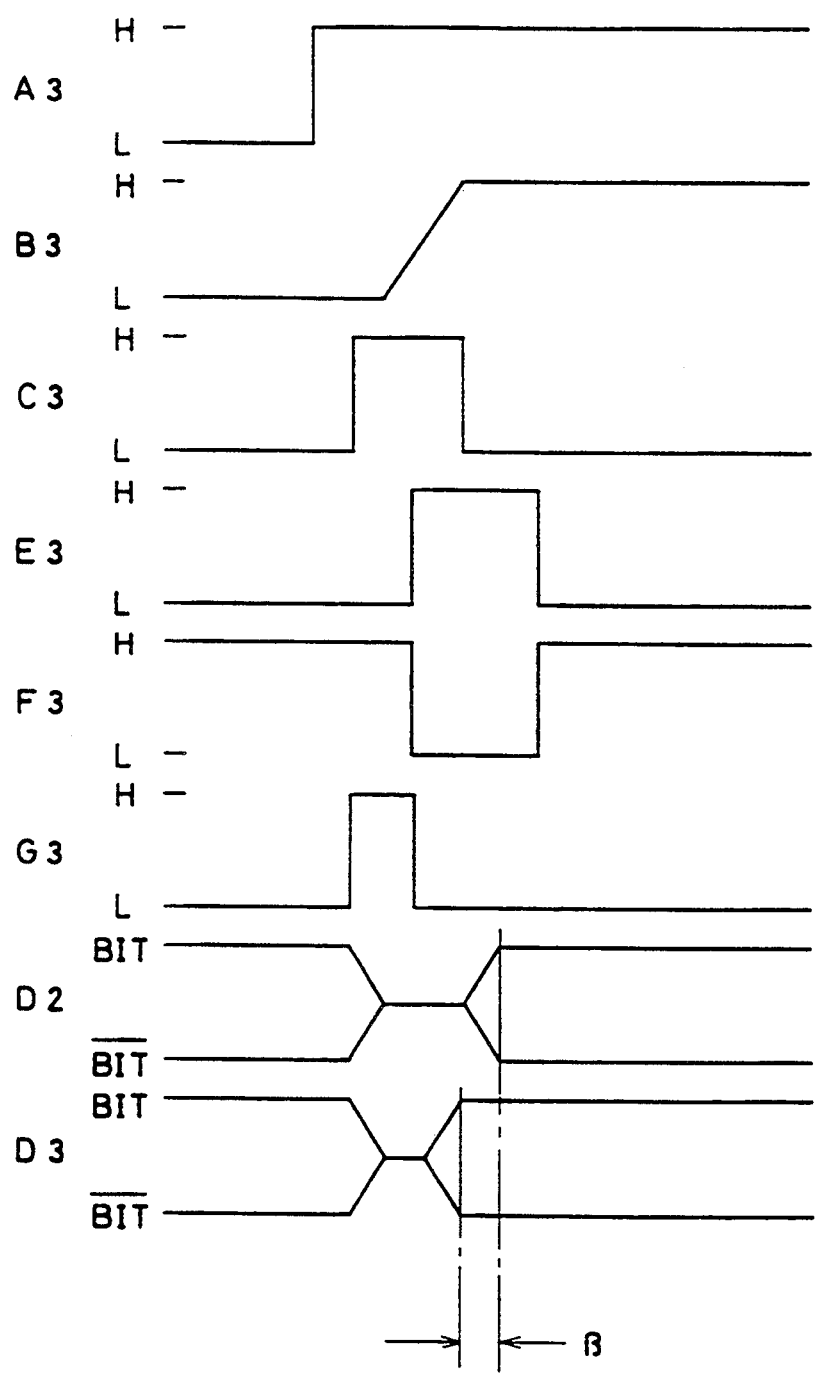
FIG. 2 is a waveform chart of various signals of the static RAM of FIG. 1.

FIG. 2 shows waveforms of various signals in the static RAM of FIG. 1. Address signal A3, word line signal B3 and ATD signal C3 are identical to the corresponding signals A2, B3, and C3 in the static RAM of the prior art of FIG. 5.

The operation of the static RAM according to an embodiment of the present invention will be explained hereinafter with reference to FIG. 1. External address signals $1_l$–$1_n$, pass through an address buffer 2 and to drive a word line selection decoder 3 and a bit line selection decoder 4. Word line selection decoder 3 selects one of word lines $6_l$–$6_n$ to which a signal of H level is transmitted.

At this time, signals of word lines $6_l$–$6_n$ are applied to a word line ATD circuit 16. Word line ATD circuit 16 senses the rise of word line signal B3 to generate a word line ATD pulse signal E3 )See FIG. 2) onto one of word line ATD output lines $17_l$–$17_n$. If at least one of word lines $6_l$–$6_n$ changes to an H level, a word line ATD pulse is generated onto one of output lines $17_{l\text{-}17n}$ of word line ATD circuit 16. In response thereto, word line ATD global circuit 18 operates. Word line ATD global circuit 18 receives the output lines $17_l$–$17_n$ of word line ATD circuit 16 to provide a word line $\overline{ATD}$ pulse signal F3 (See FIG. 2) on an output line 19. The output 19 of word line ATD global circuit 18 is provided to one input of AND circuit 11a.

The other input of AND circuit 11a is supplied with ATD pulse signal C3 (See FIG. 2) on output line 12 of ATD circuit 11. AND circuit 11a provides an AND output pulse signal G3 of an H level onto AND output line 12a only when ATD signal C3 is at an H level and word line $\overline{ATD}$ signal F3 is at an H level. Therefore, the pulse width of AND output signal G3 always terminates when word line signal B3 rises, and is normally shorter than that of ATD signal C3. Bit line signal B3 rises when the pulse of AND output signal G3 terminates, whereby BIT line and $\overline{BIT}$ line are isolated into an H level and an L level from the intermediate level, as shown by bit line pair signal D3 of FIG. 2. Because the pulse of AND output signal G3 is shorter than that of ATD signal C2 of the prior art, the access time of the static RAM of FIG. 1 is reduced by time $\beta$ indicated in FIG. 2 in comparison with the bit line pair signal D2 of the tabs RAM of the prior art of FIG. 5.

Examples of the word line ATD circuit 16 and the word ATD global circuit 18 are shown in detail in FIG. 3. Word line ATD circuit 16 comprises 1st to 4th inverters INV1, INV2, INV3, INV4, first and second p channel transistors 16P1 and 16P2, and first and second n channel transistors 16N1 and 16N2. Word line ATD global circuit 18 comprises a p channel transistor 18P1, and first to n-th n channel transistors 18N1, 18N2 . . . 18Nn.

Figure 4:
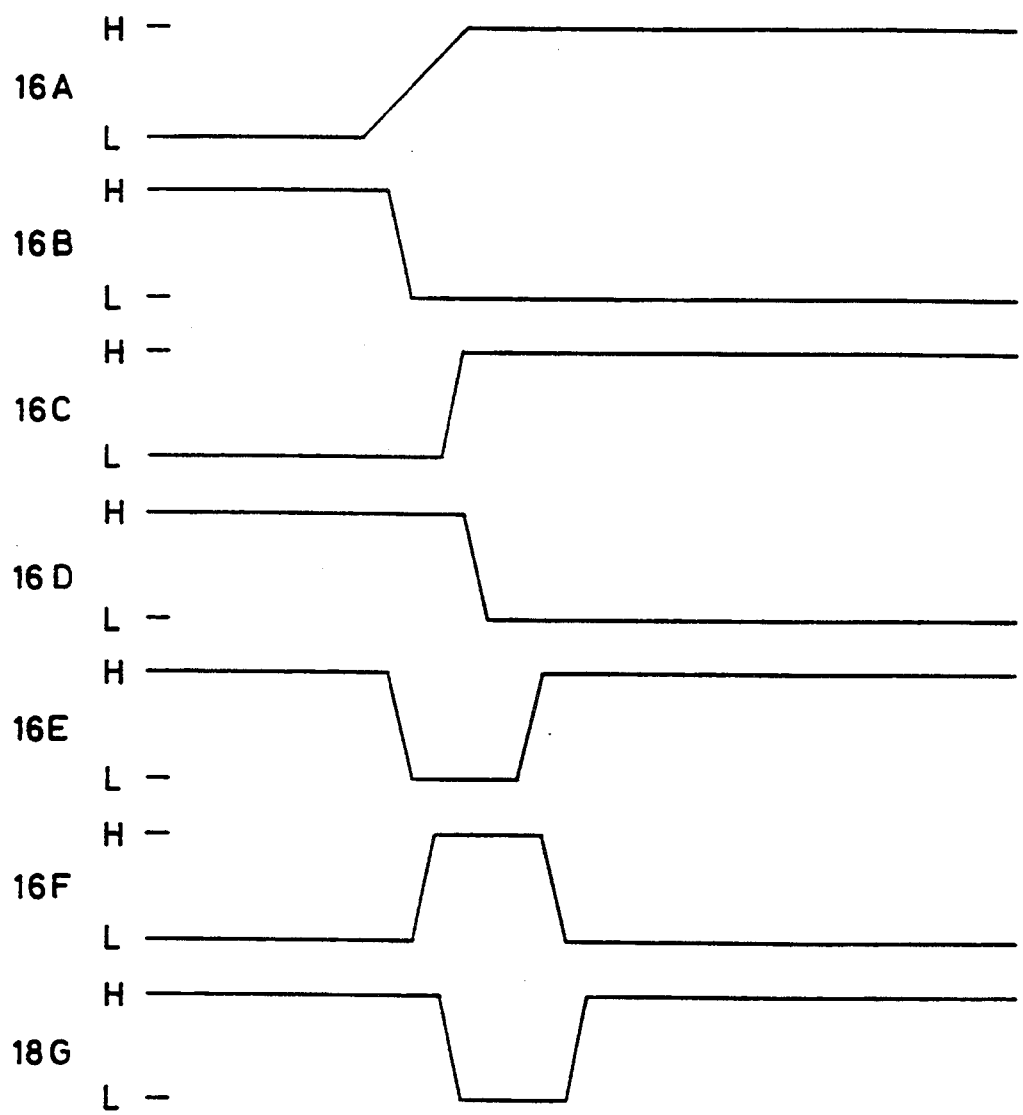
FIG. 4 is a waveform chart of signals at various nodes in the circuit of FIG. 3.

FIG. 4 shows waveforms of signals in various nodes 16A, 16B, 16C, 16D, 16E, 16F and 18G in the circuit of FIG. 3. For example, when signal 16A on word line $6_l$ rises, signal 16A is inverted by the first to third inverters INV1–INV3 to change into signals 16B, 16C and 16D in that order. Because first and second p channel transistors 16P1 and 16P2, and first and second n channel transistors 16N1 and 16N2 in word line ATD circuit 16 implement an AND circuit to which signals 16A and 16D are applied, signal 16E attains an L level when signal 16A rises during the H level of signal 16D. Then, signal 16E attains an H level when signal 16D rises during an H level of signal 16A. The pulse of the generated signal 16E will have a duration time period of approximately 2ns since one inverter normally has a delay time of approximately 300–700ps. Pulse signal 16E is inverted by the fourth inverter INV4 to become a signal 16F.

Word line ATD output lines $17_l$–$17_n$ are connected to the gates of the first to n-th n channel transistors 18N1–18Nn of ATD global circuit 18, respectively. Each of n channel transistors 18N1–18Nn has one conductive terminal grounded and the other conductive terminal connected to node 18G. Node 18G is connected to one conductive terminal of p channel transistor 18P1. The other conductive terminal and the gate of p channel transistor 18P1 are connected to a potential of H level and ground level, respectively. Therefore, if none of word lines $6_l$–$6_n$, is selected and all of word line ATD output lines $17_l$–$17_n$ are at an L level, node 18G is at an H level. However, if at least one of word line ATD output lines $17_l$–$17_n$ attains an H level, node 18G is brought to an L level. That is to say, if signal pulse 16F appears on one of word line ATD output lines $17_l$–$17_n$, pulse signal 18G appears on the output line of word line ATD global circuit 18. Pulse signal 18G is applied to AND circuit 11a as the aforementioned word line $\overline{ATD}$ pulse signal F3.

Although word line ATD circuit 16 is connected to word lines $6_l$–$6_n$ between word line decoder 3 and memory cell array 7 in the above embodiment, it should be appreciated that word line ATD circuit 16 can be connected to word lines $6_l$–$6_n$ at an arbitrary appropriate place.

It is to be understood that word line ATD circuit 16 and word line ATD global circuit 18 can be formed by a logic circuit other than that shown in FIG. 3, whereby the duration time period of word line $\overline{ATD}$ pulse signal F3 (for example, pulse signal 18G) can be extended by incorporating a capacitor at several node positions.

Considering the transmission time of the information signal from bit lines $9a_1$–$9a_n$ and $9b_1$–$9b_n$ to output buffer 14, delay means can be incorporated at a desired position on output line 12a of AND circuit 11a (See FIG. 1).

Although the above embodiment is described with a static RAM, the present invention can be applied to other various types of semiconductor memory devices.

Although the present invention has been described and illustrated in detail, it is clearly understood that the same is by way of illustration and example only and is not to be taken by way of limitation, the spirit and scope of the present invention being limited only by the terms of the appended claims.

I claim:

1. A semiconductor memory device comprising:
an array of memory cells arranged in rows and columns,
a plurality of word lines connected to the rows of said memory cells,
a plurality of bit lines connected to the columns of said memory cells,
word line selections means operatively connected to said plurality of word lines and responsive to an externally applied address signal for selecting one of said word lines,
bit line selection means operatively connected to said plurality of bit lines and responsive to said externally applied address signal for selecting at least one of said bit lines, and
equalizing means operatively connected to said plurality of bit lines for equalizing said plurality of bit lines to a desired voltage level in direct response to a change of said externally applied address signal, and for terminating said equalizing in direct response to a change of a signal on said word line in accordance with the change of said address signal.

2. The semiconductor memory device according to claim 1, wherein said word line selection means comprises address buffer means for receiving said address signal, and word line selection decoder means connected to said address buffer means and for decoding said address signal.

3. The semiconductor memory device according to claim 1, wherein said bit line selection means comprises address buffer means for receiving said address signal, bit line selection decoder means connected to said address buffer means for decoding said address signal, and a bit line selection circuit connected to said bit line selection means.

4. The semiconductor memory device according to claim 3, further comprising a sense amplifier operatively connected to said bit line selection circuit and said equalizing means,
wherein said equalizing means equalizes said sense amplifier to a desired voltage level.

5. The semiconductor memory device according to claim 4, further comprising output buffer means connected to said sense amplifier,
wherein said equalizing means is operatively connected to a signal line between said sense amplifier and said output buffer means for equalizing said signal line to a desired voltage level.

6. The semiconductor memory device according to claim 4, wherein said equalizing means is operatively connected to a signal line between said bit line selection circuit and said sense amplifier for equalizing said signal line to a desired voltage level.

7. The semiconductor memory device according to claim 1, wherein
said equalizing means comprises
an address buffer receiving said address signals,
first means operatively connected to said address buffer for sensing change in said address signal and generating an equalizing pulse in response thereto, and
second means operatively connected to said word line selection means and said first means for sensing change in a signal of said word line and terminating said equalizing pulse generated by said first means.

8. A semiconductor memory device comprising:
an array of memory cells arranged in rows and columns;
a plurality of word lines connected to the rows of said memory cells;
a plurality of bit lines connected to the columns of said memory cells;
word line selection means operatively connected to said plurality of word lines and responsive to an externally applied address signal for selecting one of said word lines;
bit line selection means operatively connected to said plurality of bit lines and response to said externally applied address signal for selecting at least one of said bit lines;
address transition detection means for providing a predetermined signal in synchronization with a change of said externally applied address signal;
word line selection detection means operatively connected to said word line selection means and responsive to the selected word line for providing a signal indicating selection of one of said word line;
gate means receiving said predetermined signal and said signal indicating selection of a word line and providing an output pulse signal; and
equalizing means operatively connected to said plurality of bit lines for equalizing said plurality of bit lines to a desired voltage level in response to said output pulse signal, wherein an equalizing period begins in response to a first change of said output pulse signal and ends in response to a second change of said output pulse signal.

9. A semiconductor memory device comprising:
an array of memory cells arranged in rows and columns,
a plurality of word lines connected to the rows of said memory cells,
a plurality of bit lines connected to the columns of said memory cells,
word line selection means operatively connected to said plurality of word lines and responsive to an externally applied address signal for selecting one of said word lines,
bit line selection means operatively connected to said plurality bit lines and responsive to said externally applied address signal for selecting at least one of said bit lines, and
equalizing means operatively connected to said plurality of bit lines for equalizing said plurality of bit lines to a desired voltage level in direct response to a change of said externally applied address signal, and for terminating said equalizing in direct response to a change of a signal on said word line in accordance with the change of said address signal, wherein said word line selection means includes a word line selection decoder and a word line address transition detector connected between said word line selection means and said array of memory cells, and said equalizing means comprises means to sense change in said address signal for generating an equalizing pulse, and means to sense change in a signal of said word line for terminating said equalizing means.

* * * * *